United States Patent
Han et al.

(10) Patent No.: US 9,269,810 B2
(45) Date of Patent: Feb. 23, 2016

(54) SEMICONDUCTOR DEVICE HAVING WAVE GATE

(71) Applicant: SAMSUNG ELECTRONICS CO., LTD., Suwon-si, Gyeonggi-do (KR)

(72) Inventors: Seung-Uk Han, Suwon-si (KR); Won-Kyung Park, Seoul (KR); Jun-Ho Park, Yongin-si (KR); Jun-Hee Lim, Seoul (KR); Ki-Jae Hur, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 14/444,155

(22) Filed: Jul. 28, 2014

(65) Prior Publication Data
US 2015/0171215 A1      Jun. 18, 2015

(30) Foreign Application Priority Data

Dec. 17, 2013   (KR) .................. 10-2013-0157444

(51) Int. Cl.
| | |
|---|---|
| *G11C 5/02* | (2006.01) |
| *H01L 29/78* | (2006.01) |
| *H01L 27/088* | (2006.01) |
| *G11C 7/06* | (2006.01) |
| *G11C 16/26* | (2006.01) |
| *G11C 11/4091* | (2006.01) |

(52) U.S. Cl.
CPC ............ *H01L 29/7835* (2013.01); *G11C 5/025* (2013.01); *G11C 7/065* (2013.01); *G11C 11/4091* (2013.01); *G11C 16/26* (2013.01); *H01L 27/088* (2013.01)

(58) Field of Classification Search
CPC ........ G11C 5/025; G11C 7/065; G11C 7/062; G11C 11/4091; G11C 16/26; H01L 29/785; H01L 29/78696; H01L 29/78; H01L 27/10823; H01L 27/115; H01L 27/088; H01L 27/11807; H01L 29/7835
USPC .............. 365/208, 207, 51, 63, 205; 257/336, 257/202, 213, E29.112, E29.126, E29.127
See application file for complete search history.

(56) References Cited

U.S. PATENT DOCUMENTS

| | | | |
|---|---|---|---|
| 7,583,550 B2 * | 9/2009 | Ohgami ..................... 365/207 |
| 7,683,402 B2 * | 3/2010 | Fujii et al. .................. 257/202 |
| 7,692,943 B2 * | 4/2010 | Osada et al. ................ 365/51 |
| 2013/0037888 A1 | 2/2013 | Han et al. | |

FOREIGN PATENT DOCUMENTS

| | | |
|---|---|---|
| JP | 08-340088 | 12/1996 |
| JP | 2010-147300 | 7/2010 |
| KR | 1020050065849 | 6/2005 |
| KR | 1020070062863 | 6/2007 |

* cited by examiner

*Primary Examiner* — David Lam
(74) *Attorney, Agent, or Firm* — F. Chau & Associates, LLC (57) ABSTRACT

A semiconductor device includes an active region defined on a substrate, a gate electrode disposed on the active region and covering two adjacent corners of the active region, a drain area formed in the active region adjacent to a first side of the gate electrode, and a source area formed in the active region adjacent to a second side of the gate electrode. The first and second sides of the gate electrode are spaced apart from each other, and the first side has a bent shape.

17 Claims, 11 Drawing Sheets

SEMICONDUCTOR DEVICE HAVING WAVE GATE

CROSS-REFERENCE TO RELATED APPLICATIONS

This application claims priority under 35 U.S.C. §119 to Korean Patent Application No. 10-2013-0157444 filed on Dec. 17, 2013, the disclosure of which is incorporated by reference herein in its entirety.

TECHNICAL FIELD

Exemplary embodiments of the inventive concept relate to a semiconductor device having a wave gate, and an electronic system including the same.

DISCUSSION OF THE RELATED ART

Various methods are being implemented in an effort to increase a gate length Lg and a gate width Wg of a transistor in a limited planar area in a semiconductor device.

SUMMARY

Exemplary embodiments of the inventive concept provide a semiconductor device capable of increasing a gate length Lg and a gate width Wg of a transistor in a limited planar area.

According to an exemplary embodiment of the inventive concept, a semiconductor device includes an active region defined on a substrate. A gate electrode crossing over the active region and covering two adjacent corners of the active region is disposed. A drain area is formed in the active region adjacent to a first side of the gate electrode. A source area is formed in the active region adjacent to a second side of the gate electrode. The first and second sides of the gate electrode are spaced apart from each other, and the first side has a bent shape.

In exemplary embodiments, the active region may include first to fourth sides and first to fourth corners. The gate electrode may cover the first corner and the second corner. The first side may be spaced apart from the fourth side, the second side may be spaced apart from the third side, the first side may be longer than the second side, and the fourth side may be longer than the third side. The first corner may be formed between the first side and the second side, the second corner may be formed between the first side and the third side, the third corner may be formed between the second side and the fourth side, and the fourth corner may be formed between the third side and the fourth side.

In exemplary embodiments, the first side of the gate electrode may cross over the first side of the active region twice. The second side of the gate electrode may cross over the second side of the active region and the third side of the active region.

In exemplary embodiments, the source area may include a first impurity area formed between the second side of the gate electrode and the second side of the active region. The source area may include a second impurity area formed between the second side of the gate electrode and the third side of the active region. The second impurity area may be spaced apart from the first impurity area.

In exemplary embodiments, a lightly doped drain (LDD) may be formed between the first impurity area and the second impurity area.

In exemplary embodiments, a first source plug may be formed on the first impurity area. A second source plug may be formed on the second impurity area. Upper ends of the first source plug and the second source plug may be connected to a source line. The first source plug and the second source plug may be equipotential.

In exemplary embodiments, the first side of the gate electrode may have a V-shape, a C-shape, a bathtub-shape, or a bumpy shape having two or more inflection points.

In exemplary embodiments, the second side of the gate electrode may have a bathtub-shape, a line-shape, a V-shape, a C-shape, or bumpy shape having two or more inflection points.

In exemplary embodiments, the drain area may have a triangular shape, a half-moon shape, or a trapezoidal shape.

In exemplary embodiments, a side of the drain area may have a bumpy shape which is aligned with the first side of the gate electrode and has two or more inflection points.

According to an exemplary embodiment of the inventive concept, a semiconductor device includes an active region defined on a substrate. A first gate electrode crossing over the active region and covering two adjacent corners of the active region is disposed. A second gate electrode crossing over the active region, symmetrical with the first gate electrode, and spaced apart from the first gate electrode is disposed. A first drain area is formed in the active region adjacent to a first side of the first gate electrode. A second drain area is formed in the active region adjacent to a first side of the second gate electrode. A source area aligned with a second side of the first gate electrode and a second side of the second gate electrode and formed in the active region, is disposed. The first side of the first gate electrode has a bent shape.

In exemplary embodiments, the active region may include first to fourth sides and first to fourth corners. The first gate electrode may cover the first corner and the second corner. The second gate electrode may cover the third corner and the fourth corner. The first side may be spaced apart from the fourth side, the second side may be spaced apart from the third side, the first side may be longer than the second side, and the fourth side may be longer than the third side. The first corner may be formed between the first side and the second side, the second corner may be formed between the first side and the third side, the third corner may be formed between the second side and the fourth side, and the fourth corner may be formed between the third side and the fourth side.

In exemplary embodiments, the source area may include a first impurity area formed between the first gate electrode, the second gate electrode, and the second side of the active region. The source area may include a second impurity area formed between the first gate electrode, the second gate electrode, and the third side of the active region. The second impurity area may be spaced apart from the first impurity area.

In exemplary embodiments, a first source plug may be formed on the first impurity area. A second source plug may be formed on the second impurity area. Upper ends of the first source plug and the second source plug may be connected to a source line. The first source plug and the second source plug may be equipotential.

According to an exemplary embodiment of the inventive concept, a semiconductor device includes a memory array including a plurality of memory cells, and a plurality of sense amplifiers connected to the memory cells. Each of the plurality of sense amplifiers includes a plurality of transistors. Each of the plurality of transistors includes an active region defined on a substrate, a first gate electrode disposed on the active region and covering two adjacent corners of the active region, a second gate electrode disposed on the active region, wherein the second gate electrode is symmetrical with the first gate electrode and is spaced apart from the first gate electrode, a first drain area formed in the active region adjacent to a first side of the first gate electrode, a second drain area formed in the active region adjacent to a first side of the second gate electrode, and a source area formed in the active region between a second side of the first gate electrode and a second side of the second electrode. The first side of the first gate electrode has a bent shape.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION OF THE EXEMPLARY EMBODIMENTS

Exemplary embodiments of the inventive concept will be described more fully hereinafter with reference to the accompanying drawings. Like reference numerals may refer to like elements throughout the accompanying drawings.

It will be understood that when an element or layer is referred to as being "on," "connected to," or "coupled to" another element or layer, it can be directly on, connected or coupled to the other element or layer or intervening elements or layers may be present.

Spatially relative terms, such as "beneath," "below," "lower," "above," "upper," etc. may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

In the drawings, the sizes and relative sizes of layers and regions may be exaggerated for clarity. As such, variations from the shapes of the illustrations as a result, for example, of manufacturing techniques and/or tolerances, may occur. Thus, exemplary embodiments should not be construed as limited to the particular shapes of regions illustrated herein but are to include deviations in shapes that may result, for example, from manufacturing.

Terms such as "front side" and "back side" may be used in a relative sense herein to facilitate understanding of the inventive concept. Accordingly, "front side" and "back side" may not refer to any specific direction, location, or component, and may be used interchangeably. For example, "front side" may be interpreted as "back side" and vice versa. Also, "front side" may be expressed as "first side," and "back side" may be expressed as "second side," and vice versa.

Figure 1:
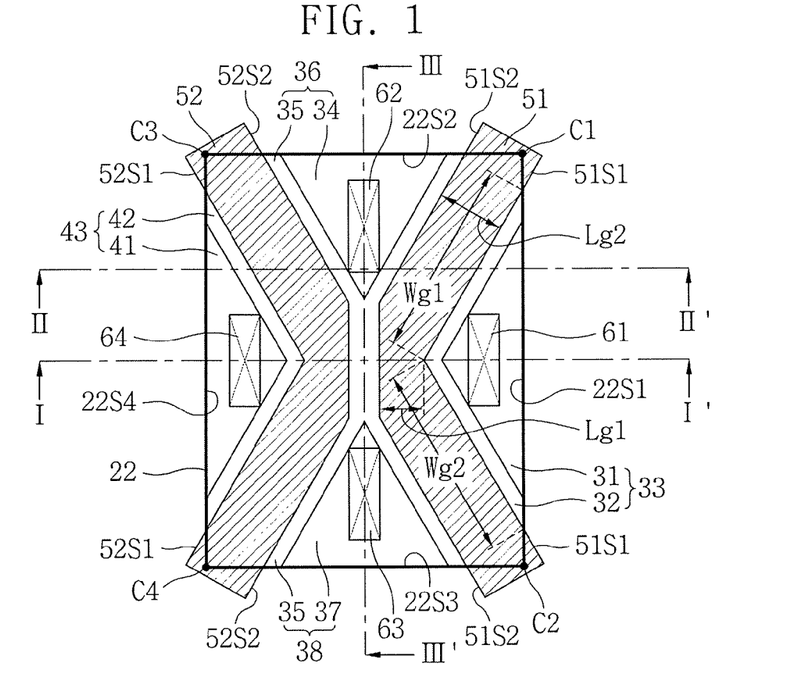
FIG. 1 is a layout view showing a semiconductor device according to exemplary embodiments of the inventive concept.
Figure 2:
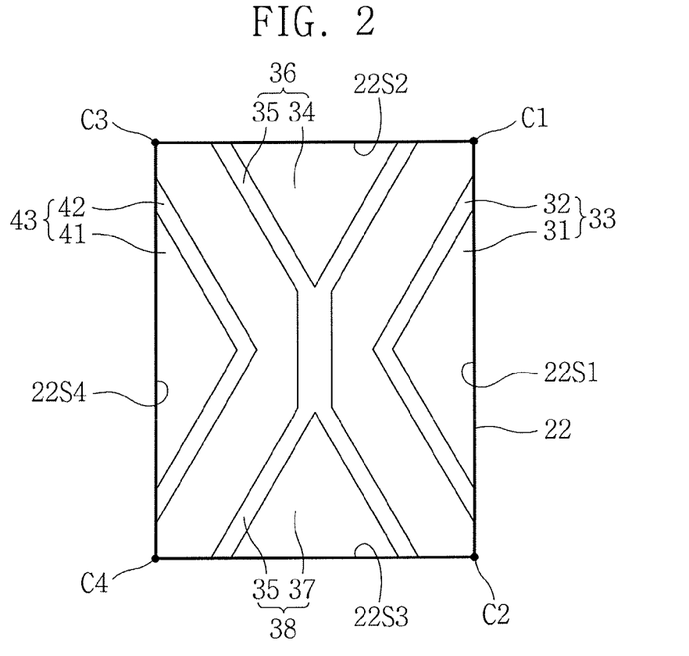
FIG. 2 is a partial layout view showing a part of FIG. 1 according to exemplary embodiments of the inventive concept.
Figure 3:
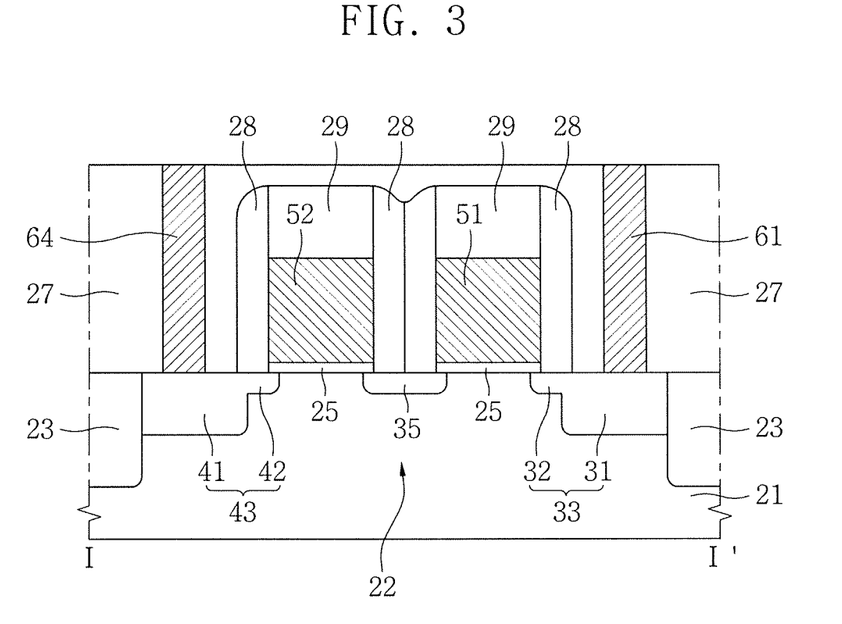
FIGS. 3 to 5 are cross-sectional views taken along lines I-I', II-II' and III-III' of FIG. 1, respectively, showing semiconductor devices according to exemplary embodiments of the inventive concept.
Figure 4:
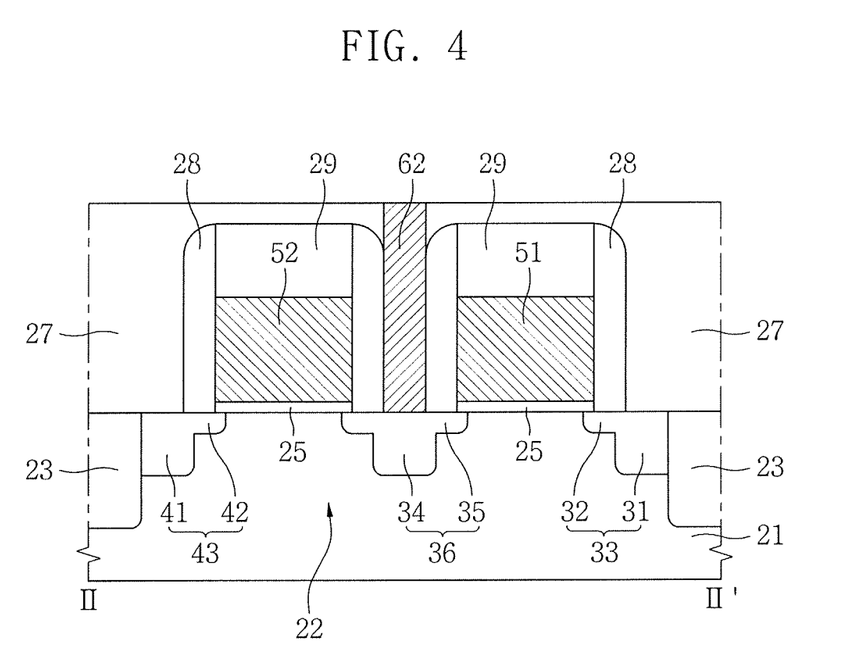
Figure 5:
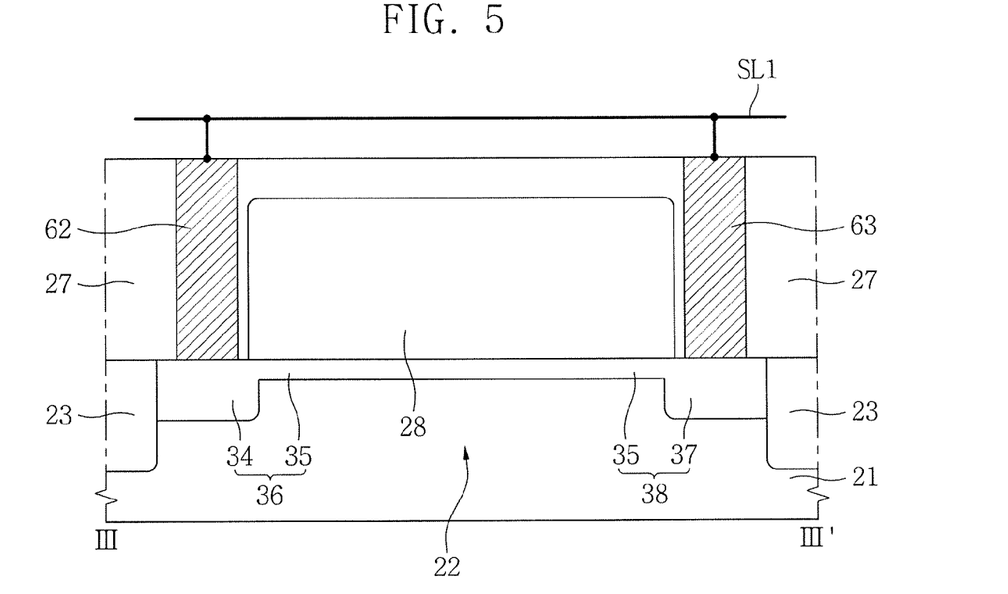

FIG. 1 is a layout view showing a semiconductor device according to exemplary embodiments of the inventive concept. FIG. 2 is a partial layout view showing a part of FIG. 1 according to exemplary embodiments of the inventive concept. FIGS. 3 to 5 are cross-sectional views taken along lines I-I', II-II', and III-III' of FIG. 1, respectively, showing semiconductor devices according to exemplary embodiments of the inventive concept.

Referring to FIGS. 1 to 5, a device isolation layer 23 defining an active region 22 may be formed on a substrate 21. A first drain area 33, a first source area 36, a second source area 38, and a second drain area 43 are formed in the active region 22. The first drain area 33 may include a first impurity area 31 and a first lightly doped drain (LDD) 32. The first source area 36 may include a second impurity area 34 and a second LDD 35. The second source area 38 may include a third impurity area 37 and the second LDD 35. The second drain area 43 may include a fourth impurity area 41 and a third LDD 42.

A first gate electrode 51 and a second gate electrode 52 may be formed on the active region 22. A gate dielectric layer 25 is formed between the active region 22 and the first gate electrode 51, and between the active region 22 and the second gate electrode 52. A capping layer 29 is formed on the first gate electrode 51 and the second gate electrode 52. Spacers 28 may be formed on side surfaces of the first gate electrode 51 and the second gate electrode 52. An interlayer insulating layer 27 may be formed on the substrate 21. A first drain plug 61, a first source plug 62, a second source plug 63, and a second drain plug 64, which pass through the interlayer insulating layer 27, may be formed. The first source plug 62 and the second source plug 63 may be connected to a source line SL1.

The substrate 21 may be a semiconductor substrate such as, for example, a silicon wafer or a silicon-on-insulator (SOI) wafer. For example, the substrate 21 may include single crystalline silicon having, for example, p-type impurities. The active region 22 may be defined by the device isolation layer 23 in a predetermined region of the substrate 21. The active region 22 may include, for example, p-type impurities or n-type impurities. Hereinafter, exemplary embodiments in which the active region 22 is single crystalline silicon having p-type impurities is described. However, exemplary embodiments are not limited thereto. For example, the active region 22 may be single crystalline silicon having n-type impurities. The device isolation layer 23 may be formed using, for example, a shallow trench isolation (STI) technique. The device isolation layer 23 may include an insulating layer such as, for example, silicon oxide, silicon nitride, silicon oxynitride, or a combination thereof.

In exemplary embodiments, the active region 22 may have a rectangular shape. The active region 22 may include first to fourth sides 22S1, 22S2, 22S3, and 22S4, and first to fourth corners C1, C2, C3, and C4. The first side 22S1 may be spaced apart from and disposed opposite the fourth side 22S4, and the second side 22S2 may be spaced apart from and disposed opposite the third side 22S3. The first side 22S1 and the fourth side 22S4 may be longer than the second side 22S2 and the third side 22S3. The first side 22S1 and the fourth side 22S4 may be about the same length, and the second side 22S2 and the third side 22S3 may be about the same length. The first corner C1 may be formed between the first side 22S1 and the second side 22S2. The second corner C2 may be formed between the first side 22S1 and the third side 22S3. The third corner C3 may be formed between the second side 22S2 and the fourth side 22S4. The fourth corner C4 may be formed between the third side 22S3 and the fourth side 22S4.

Each of the first gate electrode 51 and the second gate electrode 52 may be disposed on and cross the active region 22, and may extend onto the device isolation layer 23. Each of the first gate electrode 51 and the second gate electrode 52 may have, for example, a bent shape. For example, first sides (e.g., 51S1 and 52S1) of each of the first gate electrode 51 and the second gate electrode 52 may have a bent shape corresponding to, for example, a V-shape, a C-shape, a bathtub-shape, or a bumpy shape, as described in further detail below. The first gate electrode 51 and the second gate electrode 52 may form a wave gate.

The first gate electrode 51 may cover the first corner C1 and the second corner C2. The first gate electrode 51 may include a first side 51S1 and a second side 51S2. The first side 51S1 and the second side 51 S2 may be spaced apart from and disposed opposite each other. The first side 51S1 may have, for example, a V-shape, as shown in FIG. 1. The V-shape may be bent at, for example, one point. The first side 51S1 of the first gate electrode 51 may cross over the first side 22S1 of the active region 22. For example, as shown in FIG. 1, the first side 51S1 of the first gate electrode 51 crosses over the first side 22S1 of the active region 22 twice (e.g., in an area near the first corner C1 and in an area near the second corner C2). The second side 51S2 of the first gate electrode 51 may have, for example, a bathtub-shape, as described in further detail with reference to FIG. 6. The bathtub-shape may be bent at, for example, two points. The second side 51S2 of the first gate electrode 51 may cross over the second side 22S2 of the active region 22 and the third side 22S3 of the active region 22, as shown in FIG. 1.

The second gate electrode 52 may cover the third corner C3 and the fourth corner C4. The second gate electrode 52 may include a first side 52S1 and a second side 52S2. The first side 52S1 and the second side 52S2 may be spaced apart from and disposed opposite each other. The first side 52S1 may have, for example, a V-shape, as shown in FIG. 1. The first side 52S1 of the second gate electrode 52 may cross over the fourth side 22S4 of the active region 22. For example, as shown in FIG. 1, the first side 52S1 of the second gate electrode 52 crosses over the fourth side 22S4 of the active region 22 twice (e.g., in an area near the third corner C3 and in an area near the fourth corner C4). The second side 52S2 of the second gate electrode 52 may have, for example, a bathtub-shape, as described in further detail with reference to FIG. 6. The second side 52S2 of the second gate electrode 52 may cross over the second side 22S2 of the active region 22 and the third side 22S3 of the active region 22. The second gate electrode 52 may be symmetrical with the first gate electrode 51.

In exemplary embodiments, the first side 51S1 of the first gate electrode 51 may have, for example, a C-shape, a bathtub-shape, or a bumpy shape having two or more inflection points. The second side 51S2 of the first gate electrode 51 may have, for example, a V-shape, a C-shape, a line-shape, or a bumpy shape having two or more inflection points. Similarly, the first side 52S1 of the second gate electrode 52 may have, for example, a C-shape, a bathtub-shape, or a bumpy shape having two or more inflection points, and the second side 52S2 of the second gate electrode 52 may have, for example, a V-shape, a C-shape, a line-shape, or a bumpy shape having two or more inflection points.

The first drain area 33, the first source area 36, the second source area 38, and the second drain area 43 may be formed in the active region 22 adjacent to the first gate electrode 51 and the second gate electrode 52. The first drain area 33, the first source area 36, the second source area 38, and the second drain area 43 may be aligned with outer sides of the first gate electrode 51 and the second gate electrode 52.

The first drain area 33 may be aligned between the first side 51S1 of the first gate electrode 51 and the first side 22S1 of the active region 22. The first drain area 33 may have, for example, a triangular shape. The second drain area 43 may be aligned between the first side 52S1 of the second gate electrode 52 and the fourth side 22S4 of the active region 22. The second drain area 43 may have, for example, a triangular shape.

In exemplary embodiments, each of the first drain area 33 and the second drain area 43 may have, for example, a half-moon shape or a trapezoidal shape. A side of the first drain area 33 may have, for example, a bumpy shape aligned with the first side 51S1 of the first gate electrode 51 and may have two or more inflection points. A side of the second drain area 43 may have, for example, a bumpy shape aligned with the first side 52S1 of the second gate electrode 52 and may have two or more inflection points.

The first source area 36 may be aligned between the second side 51S2 of the first gate electrode 51, the second side 52S2 of the second gate electrode 52, and the second side 22S2 of the active region 22. The second impurity area 34 of the first source area 36 may have, for example, a triangular shape. The second source area 38 may be aligned between the second side 51S2 of the first gate electrode 51, the second side 52S2 of the second gate electrode 52, and the third side 22S3 of the active region 22. The third impurity area 37 of the second source area 38 may have, for example, a triangular shape. The third impurity area 37 of the second source area 38 may be spaced apart from the second impurity area 34 of the first source area 36. The second LDD 35 may be formed between the second impurity area 34 and the third impurity area 37, as shown in FIG. 5. The second LDD 35 may be aligned along the second side 51S2 of the first gate electrode 51 and the second side 52S2 of the second gate electrode 52.

The first drain area 33, the first source area 36, the second source area 38, and the second drain area 43 may include different conductivity type impurities from the active region 22. For example, in an exemplary embodiment, the active region 22 may include p-type impurities, and the first drain area 33, the first source area 36, the second source area 38, and the second drain area 43 may include n-type impurities. In this embodiment, the first to fourth impurity areas 31, 34, 37, and 41, and the first to third LDDs 32, 35, and 42 may include n-type impurities. In an exemplary embodiment, the active region 22 may include n-type impurities, and the first drain area 33, the first source area 36, the second source area 38, and the second drain area 43 may include p-type impurities. In this embodiment, the first to fourth impurity areas 31, 34, 37, and 41, and the first to third LDDs 32, 35, and 42 may include p-type impurities.

In exemplary embodiments, the first source area 36 and the second source area 38 may include the same conductivity type impurities as the active region 22. For example, in an exemplary embodiment, the active region 22 may include p-type impurities, and the first source area 36 and the second source area 38 may also include p-type impurities. In this embodiment, the second impurity area 34, the third impurity area 37, and the second LDD 35 may include p-type impurities. In an exemplary embodiment, the active region 22 may include n-type impurities, and the first source area 36 and the second source area 38 may also include n-type impurities. In this embodiment, the second impurity area 34, the third impurity area 37, and the second LDD 35 may include n-type impurities.

The gate dielectric layer 25 may include, for example, silicon oxide, silicon nitride, silicon oxynitride, high-K dielectrics, or a combination thereof. The gate dielectric layer 25 may be interposed between the active region 22 and the first gate electrode 51, and between the active region 22 and the second gate electrode 52. The gate dielectric layer 25 may be in direct contact with the active region 22, the first gate electrode 51, and the second gate electrode 52. The first gate electrode 51 and the second gate electrode 52 may include a conductive layer such as, for example, polysilicon, a metal, a metal nitride, a metal silicide, a metal oxide, conductive carbon, or a combination thereof. The capping layer 29 may include an insulating layer such as, for example, silicon oxide, silicon nitride, silicon oxynitride, or a combination thereof.

The spacers 28 may cover side surfaces of the first gate electrode 51, the second gate electrode 52, and the capping layer 29. The spacers 28 may include an insulating layer such as, for example, silicon oxide, silicon nitride, silicon oxynitride, or a combination thereof. The interlayer insulating layer 27 may cover the device isolation layer 23, the first gate electrode 51, the second gate electrode 52, the spacers 28, and the capping layer 29. The interlayer insulating layer 27 may include an insulating layer such as, for example, silicon oxide, silicon nitride, silicon oxynitride, or a combination thereof.

Each of the first drain plug 61, the first source plug 62, the second source plug 63, and the second drain plug 64 may include a conductive layer such as, for example, polysilicon, a metal, a metal nitride, a metal silicide, a metal oxide, conductive carbon, or a combination thereof. The first drain plug 61 may pass through the interlayer insulating layer 27 to be in direct contact with the first impurity area 31. The first source plug 62 may pass through the interlayer insulating layer 27 to be in direct contact with the second impurity area 34. The second source plug 63 may pass through the interlayer insulating layer 27 to be in direct contact with the third impurity area 37. Upper ends of the first source plug 62 and the second source plug 63 may be connected to the source line SL1. In an exemplary embodiment, the first source plug 62 and the second source plug 63 are connected to the source line SL1 to form an equipotential structure. The second drain plug 64 may pass through the interlayer insulating layer 27 to be in direct contact with the fourth impurity area 41.

According to exemplary embodiments of the inventive concept, a gate width Wg of the first gate electrode 51 may be about equal to the sum of a first width Wg1 and a second width Wg2 of the first gate electrode 51. The gate width Wg of the first gate electrode 51 according to exemplary embodiments may be significantly increased compared to conventional devices. A gate length Lg of the first gate electrode 51 may be proportional to the average of a first length Lg1 and a second length Lg2 of the first gate electrode 51. The gate length Lg of the first gate electrode 51 according to exemplary embodiments may be significantly increased compared to conventional devices. As a result of the increase in the gate width Wg and the gate length Lg, a semiconductor device that achieves high integration may be implemented according to exemplary embodiments of the inventive concept.

Figure 6:
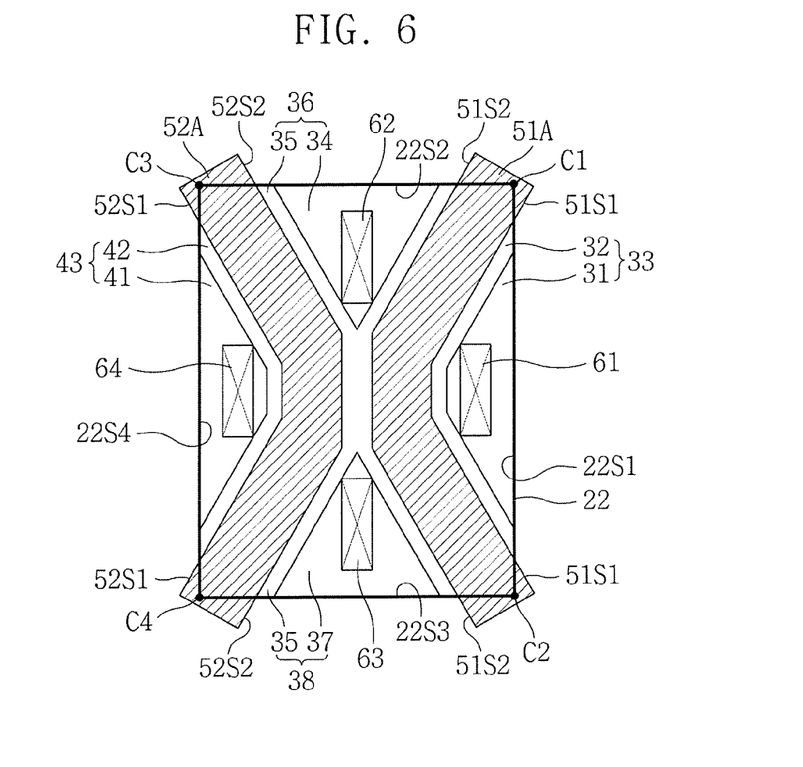
FIGS. 6 and 7 are layout views showing semiconductor devices according to exemplary embodiments of the inventive concept.
Figure 7:
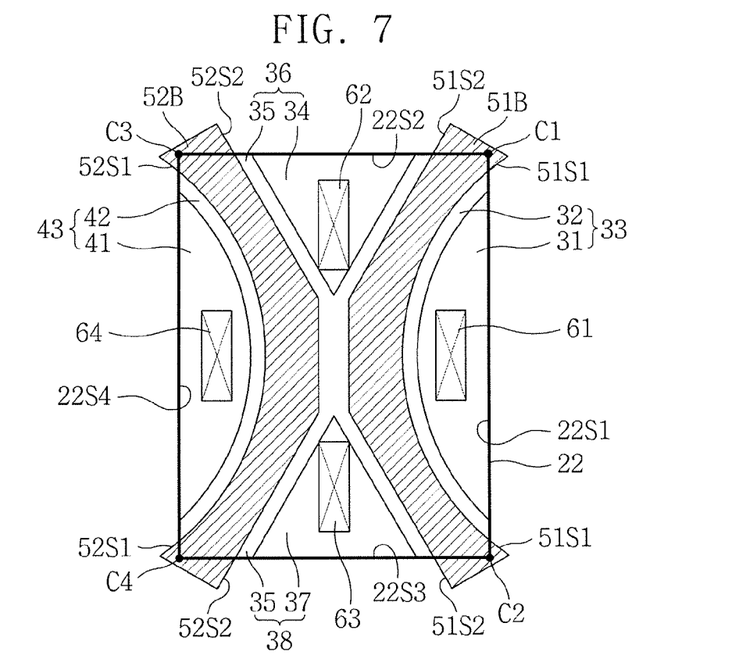

FIGS. 6 and 7 are layout views showing semiconductor devices according to exemplary embodiments of the inventive concept. For convenience of explanation, a description of elements previously described may be omitted.

Referring to FIG. 6, a first side 51S1 of a first gate electrode 51A may have a bathtub-shape and a first side 52S1 of a second gate electrode 52A may have a bathtub-shape. For example, as shown in FIG. 6, each of the first side 51S1 of the first gate electrode 51A and the first side 52S1 of the second gate electrode 52A may include first, second and third portions. The first and second portions may extend inward from the first side 22S1 of the active region 22 and the fourth side 22S4 of the active region 22, and may connect to each other via the third portion, which extends substantially parallel to the first side 22S1 of the active region 22 and the fourth side 22S4 of the active region 22.

Referring to FIG. 7, a first side 51S1 of a first gate electrode 51B may have a C-shape and a first side 52S1 of a second gate electrode 52B may have a C-shape. For example, as shown in FIG. 7, each of the first side 51S1 of the first gate electrode 51B and the first side 52S1 of the second gate electrode 52B may extend inward from the first side 22S1 of the active region 22 and the fourth side 22S4 of the active region 22 in a circular/curved manner.

Figure 8:
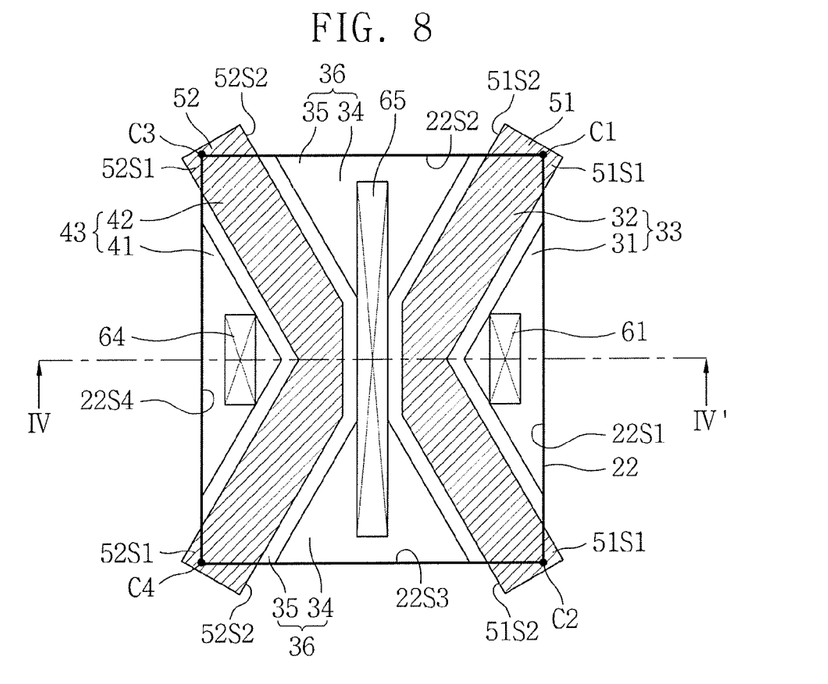
FIG. 8 is a layout view showing a semiconductor device according to exemplary embodiments of the inventive concept.
Figure 9:
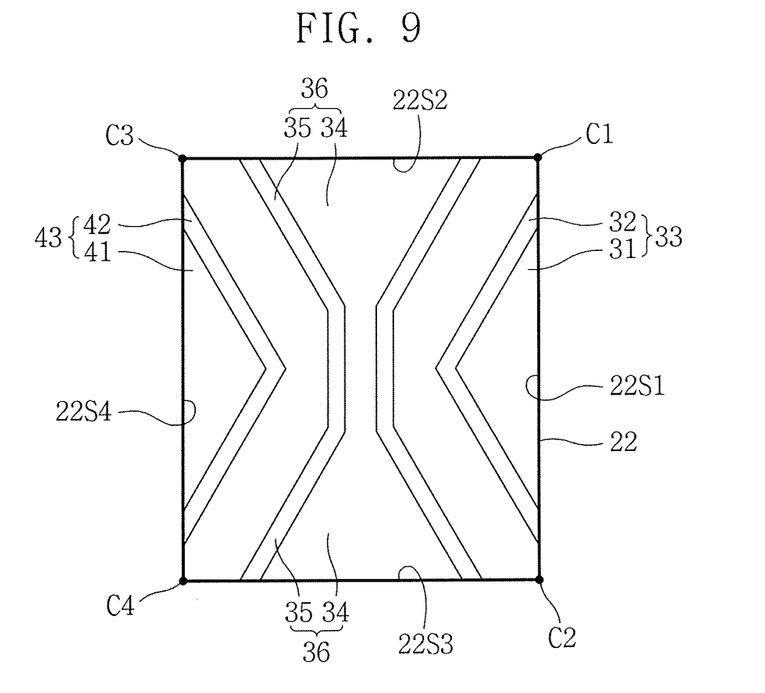
FIG. 9 is a partial layout view showing a part of FIG. 8 according to exemplary embodiments of the inventive concept.
Figure 10:
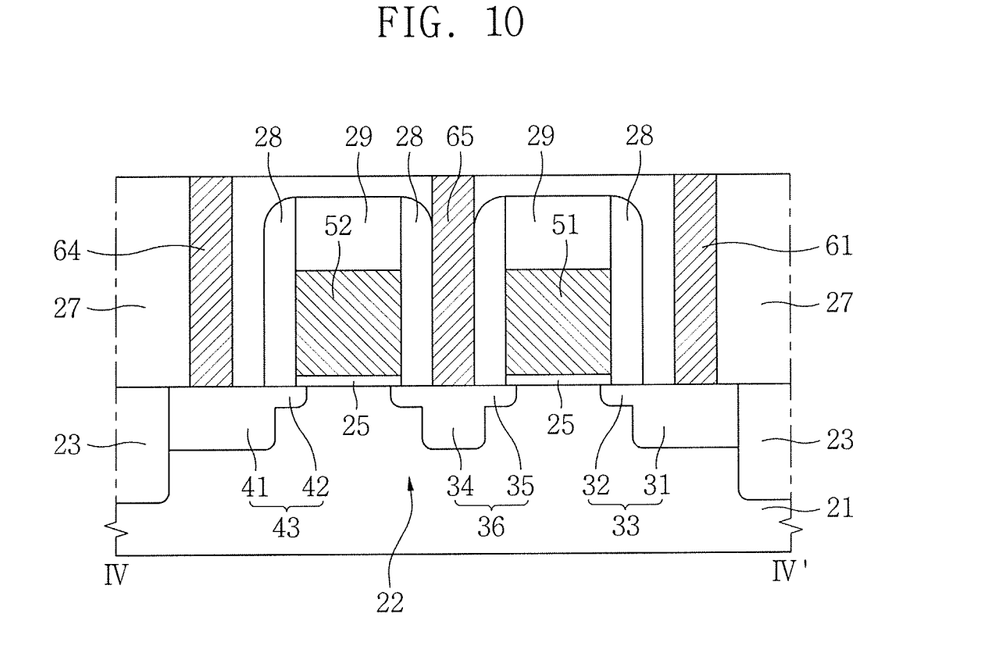
FIG. 10 is a cross-sectional view taken along line IV-IV' of FIG. 8 showing a semiconductor device according to exemplary embodiments of the inventive concept.

FIG. 8 is a layout view showing a semiconductor device according to exemplary embodiments of the inventive concept. FIG. 9 is a partial layout view showing a part of FIG. 8 according to exemplary embodiments of the inventive concept. FIG. 10 is a cross-sectional view taken along line IV-IV' of FIG. 8 showing a semiconductor device according to exemplary embodiments of the inventive concept. For convenience of explanation, a description of elements previously described may be omitted.

Referring to FIGS. 8 to 10, a first source area 36 may be formed between a first gate electrode 51 and a second gate electrode 52. The first source area 36 may include a second impurity area 34 and a second LDD 35. A source plug 65 passing through an interlayer insulating layer 27 to be in direct contact with the second impurity area 34 may be formed. The first source area 36 may be aligned between a second side 51S2 of the first gate electrode 51, a second side 52S2 of the second gate electrode 52, a second side 22S2 of an active region 22, and a third side 22S3 of the active region 22.

Figure 11:
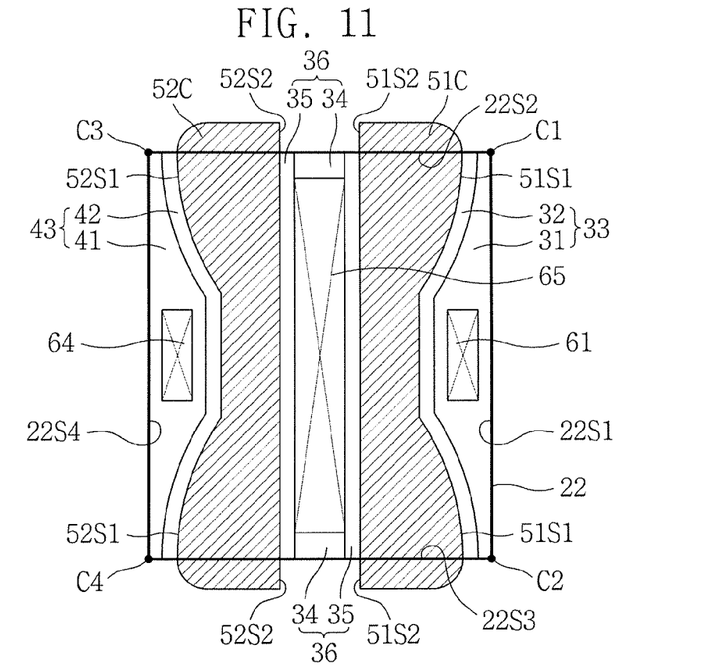
FIGS. 11 and 12 are layout views showing semiconductor devices according to exemplary embodiments of the inventive concept.
Figure 12:
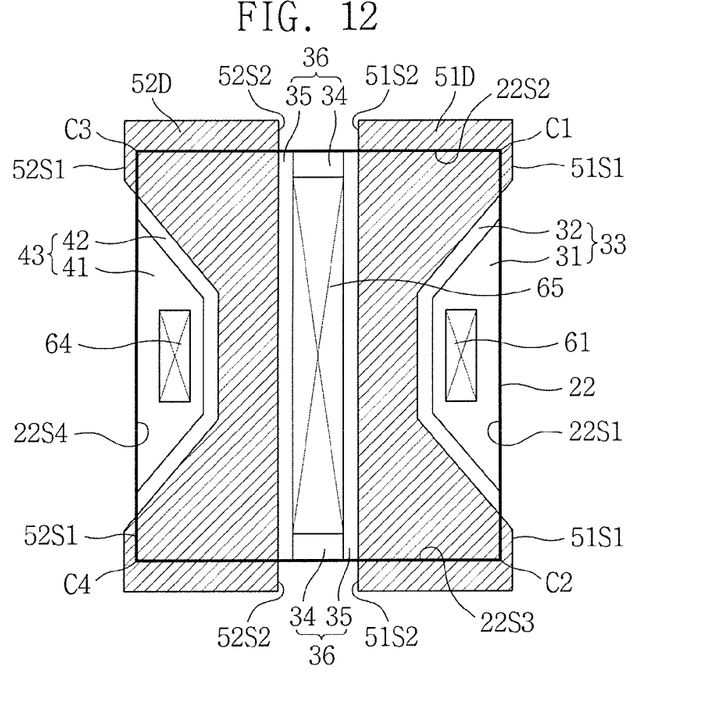

FIGS. 11 and 12 are layout views showing semiconductor devices according to exemplary embodiments of the inventive concept. For convenience of explanation, a description of elements previously described may be omitted.

Referring to FIG. 11, a first gate electrode 51C may cross over a second side 22S2 of an active region 22 and a third side 22S3 of the active region 22. A second gate electrode 52C may cross over the second side 22S2 of the active region 22 and the third side 22S3 of the active region 22.

A second side 51S2 of the first gate electrode 51C and a second side 52S2 of the second gate electrode 52C may have a line-shape. A first side 51S1 of the first gate electrode 51C may cross over the second side 22S2 of the active region 22 and the third side 22S3 of the active region 22. A first side 52S1 of the second gate electrode 52C may cross over the second side 22S2 of the active region 22 and the third side 22S3 of the active region 22. First to fourth corners C1, C2, C3, and C4 of the active region 22 may not overlap the first gate electrode 51C and the second gate electrode 52C.

The first side 51S1 of the first gate electrode 51C may have a bathtub-shape, or a bumpy shape having two or more inflection points. The first side 5251 of the second gate electrode 52C may have a bathtub-shape, or a bumpy shape having two or more inflection points. A side of a first drain area 33 may have a bumpy shape aligned with the first side 51S1 of the first gate electrode 51C and have two or more inflection points. A side of a second drain area 43 may have a bumpy shape aligned with the first side 52S1 of the second gate electrode 52C and have two or more inflection points.

Referring to FIG. 12, a first gate electrode 51D may cover a first corner C1 and a second corner C2 of an active region 22. A second gate electrode 52D may cover a third corner C3 and a fourth corner C4 of the active region 22. A second side 51S2 of the first gate electrode 51D and a second side 52S2 of the second gate electrode 52D may have a line-shape. A first side 51S1 of the first gate electrode 51D may cross over a first side 22S1 of the active region 22 twice. The first side 515S of the first gate electrode 51D may have a bathtub-shape. A first side 52S1 of the second gate electrode 52D may cross over a fourth side 22S4 of the active region 22 twice. The first side 52S1 of the second gate electrode 52D may have a bathtub-shape. Each of a first drain area 33 and a second drain area 43 may have a trapezoidal shape.

The exemplary embodiments described with reference to FIGS. 1 to 12 have been described as n-type metal oxide semiconductor (NMOS) transistors, however, exemplary embodiments are not limited thereto. For example, the exemplary embodiments described with reference to FIGS. 1 to 12 may also be applied to p-type metal oxide semiconductor (PMOS) transistors. For example, the active region 22 may include n-type impurities, and the first drain area 33, the first source area 36, the second source area 38, and the second drain area 43 may include p-type impurities.

Figure 13:
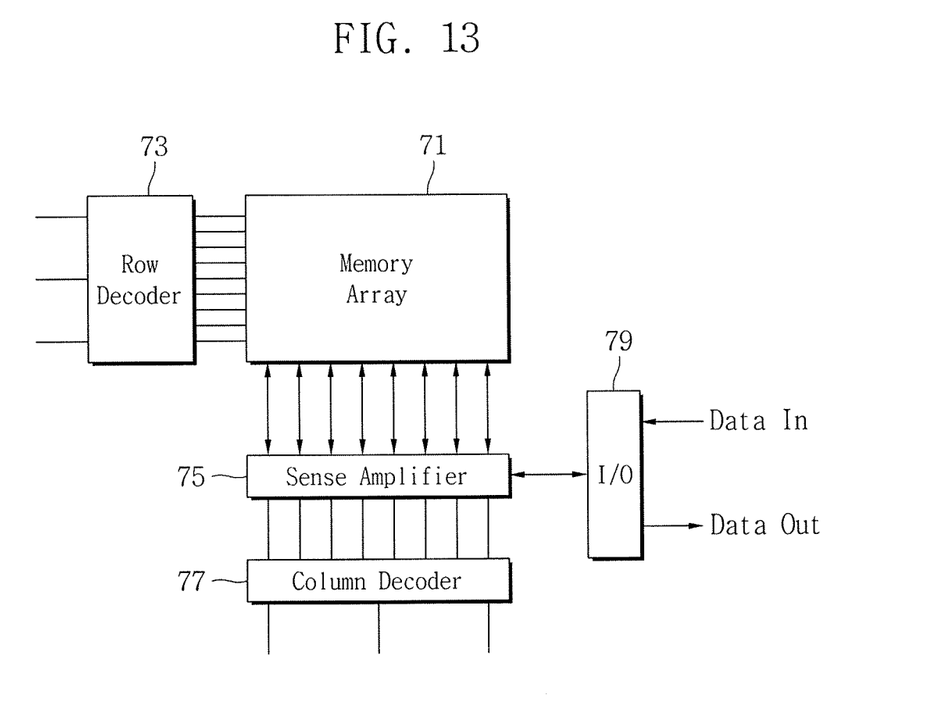
FIGS. 13 and 14 are block diagrams showing semiconductor devices according to exemplary embodiments of the inventive concept.
Figure 14:
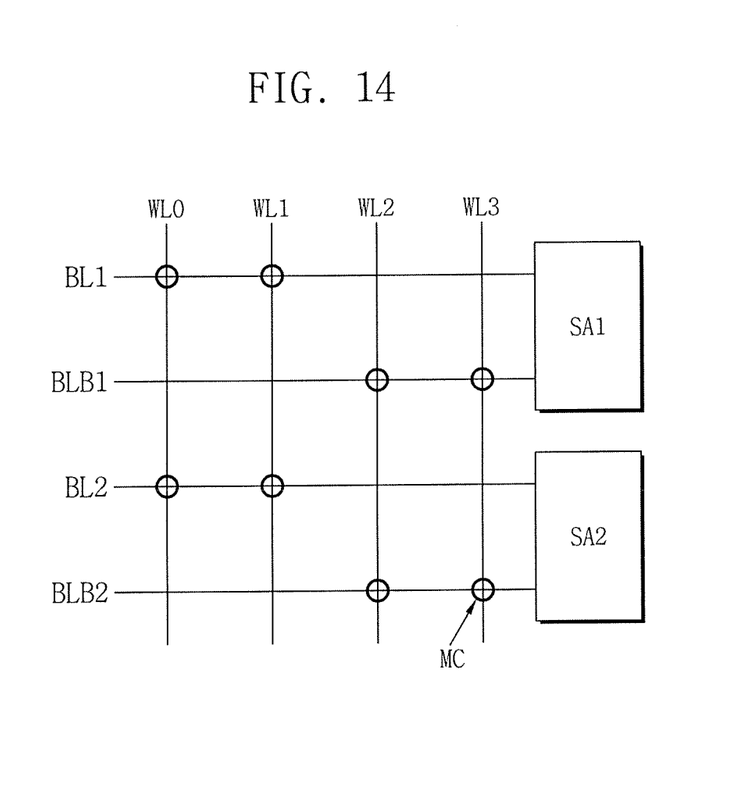
Figure 15:
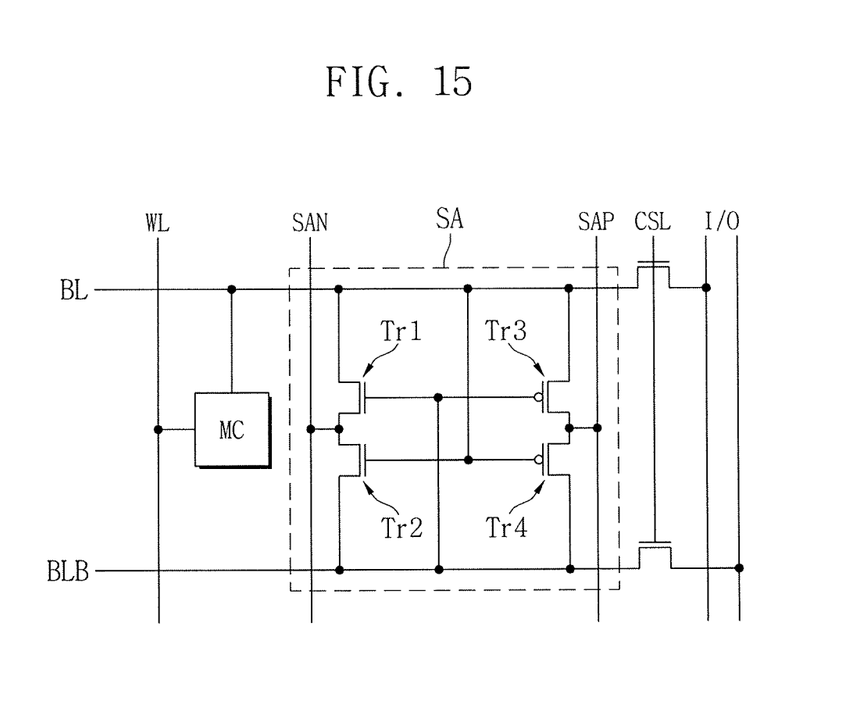
FIG. 15 is an equivalent circuit diagram showing a configuration of a sense amplifier according to exemplary embodiments of the inventive concept.

FIGS. 13 and 14 are block diagrams showing semiconductor devices according to exemplary embodiments of the inventive concept. FIG. 15 is an equivalent circuit diagram showing a configuration of a sense amplifier according to exemplary embodiments of the inventive concept.

Referring to FIG. 13, a semiconductor device according to exemplary embodiments of the inventive concept may include, for example, a memory array 71, a row decoder 73, a sense amplifier block 75, a column decoder 77, and an input/output (I/O) interface 79.

Referring to FIG. 14, memory cells MC may be formed at intersections of word lines WL0, WL1, WL2, and WL3, and bit lines BL1, BLB1, BL2, and BLB2. A first bit line BL1 and a first reference bit line BLB1 may be connected to a first sense amplifier SA1. A second bit line BL2 and a second reference bit line BLB2 may be connected to a second sense amplifier SA2.

Referring to FIG. 15, a memory cell MC may be formed at an intersection of a word line WL and a bit line BL. The bit line BL and a reference bit line BLB may be connected to a sense amplifier SA. The sense amplifier SA may be connected to an I/O interface via a selection line CSL. The sense amplifier SA may be controlled by a first control line SAN and a second control line SAP. The sense amplifier SA may include first to fourth transistors Tr1, Tr2, Tr3, and Tr4. The first and second transistors Tr1 and Tr2 may be, for example, NMOS transistors, and the third and fourth transistors Tr3 and Tr4 may be, for example, PMOS transistors.

Referring again to FIGS. 13 to 15, the sense amplifier block 75 may include, for example, a plurality of sense amplifiers SA, SA1, and SA2 corresponding to the memory cells MC of the memory array 71. Each of the sense amplifiers SA, SA1, and SA2 may include the first to fourth transistors Tr1, Tr2, Tr3, and Tr4. The first to fourth transistors Tr1, Tr2, Tr3, and Tr4 may require a high current driving ability relative to the memory cells MC. The semiconductor devices described with reference to FIGS. 1 to 12 may be applied to the first to fourth transistors Tr1, Tr2, Tr3, and Tr4. Thus, according to exemplary embodiments of the inventive concept, a semiconductor device capable of achieving high integration and having improved electrical characteristics may be implemented.

Figure 16:
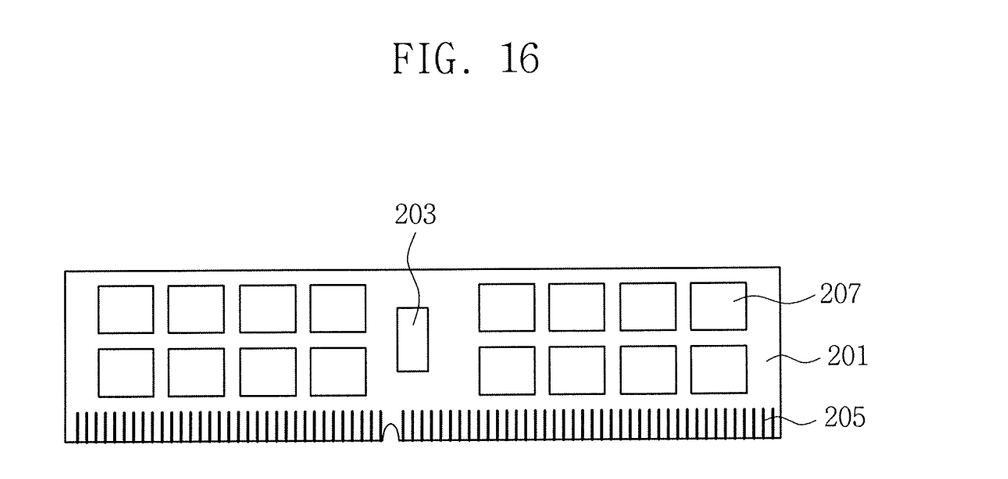
FIG. 16 is a layout view showing a semiconductor module according to exemplary embodiments of the inventive concept.

FIG. 16 is a layout view showing a semiconductor module according to exemplary embodiments of the inventive concept.

Referring to FIG. 16, a semiconductor module according to exemplary embodiments of the inventive concept may include a module substrate 201, a plurality of semiconductor packages 207, and a control chip package 203. I/O terminals 205 may be formed on the module substrate 201. At least one of the semiconductor packages 207 and the control chip package 203 may include a configuration as described with reference to FIGS. 1 to 15. The semiconductor packages 207 and the control chip package 203 may be installed on the module substrate 201. The semiconductor packages 207 and the control chip package 203 may be electrically connected to the I/O terminals 205 in series or in parallel.

In an exemplary embodiment, the control chip package 203 may be omitted. The semiconductor packages 207 may include a volatile memory chip such as, for example, a dynamic random access memory (DRAM) or a static random access memory (SRAM), a non-volatile memory chip such as, for example, a flash memory, a phase change memory, a magnetic random access memory (MRAM), a resistive random access memory (RRAM), or a combination thereof. The semiconductor module according to exemplary embodiments of the inventive concept may be, for example, a memory module.

Figure 17:
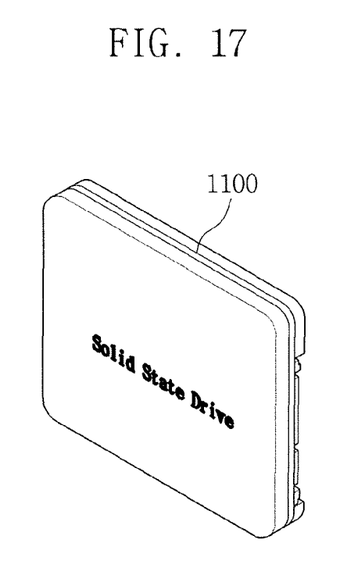
FIG. 17 is a perspective view of an electronic apparatus according to exemplary embodiments of the inventive concept.
Figure 18:
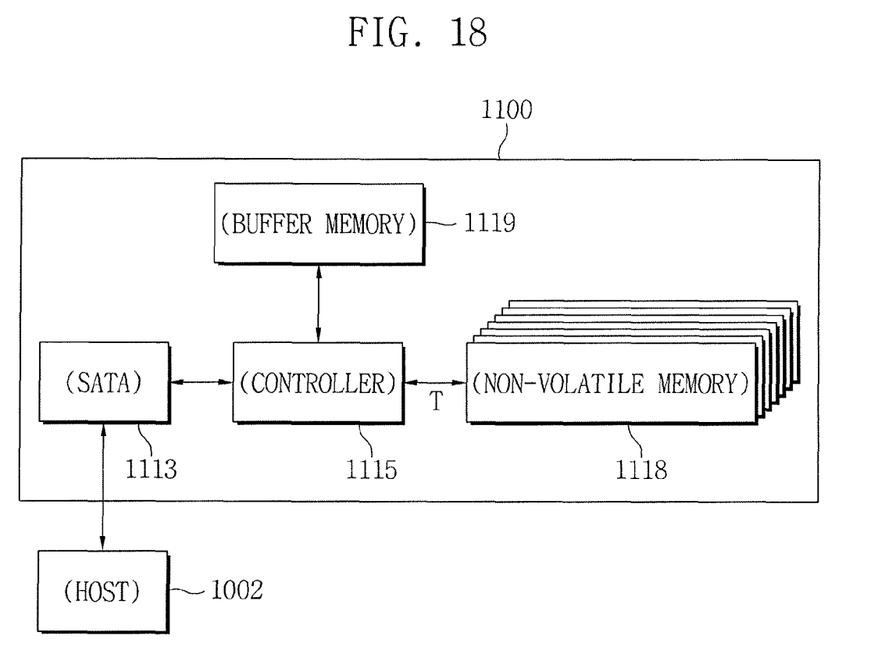
FIG. 18 is a system block diagram of an electronic apparatus according to exemplary embodiments of the inventive concept.

FIG. 17 is a perspective view of an electronic apparatus according to exemplary embodiments of the inventive concept. FIG. 18 is a system block diagram of an electronic apparatus according to exemplary embodiments of the inventive concept. The electronic apparatus may be a data storage device such as, for example, a solid state drive (SSD) 1100.

Referring to FIGS. 17 and 18, the SSD 1100 may include, for example, an interface 1113, a controller 1115, a non-volatile memory 1118, and a buffer memory 1119. The SSD 1100 may be an apparatus that stores information using a semiconductor device. The SSD 1100 is typically faster, has a lower mechanical delay or failure rate, and generates less heat and noise than a hard disk drive (HDD). Further, the SSD 1100 may be smaller and lighter than the HDD. The SSD

1100 may be used in, for example, a laptop computer, a netbook, a desktop PC, an MP3 player, a portable storage device, etc.

The controller 1115 may be formed close to the interface 1113 and electrically connected thereto. The controller 1115 may be, for example, a microprocessor including a memory controller and a buffer controller. The non-volatile memory 1118 may be formed close to the controller 1115 and electrically connected thereto. Data storage capacity of the SSD 1100 may correspond to the capacity of the non-volatile memory 1118. The buffer memory 1119 may be formed close to the controller 1115 and electrically connected thereto.

The interface 1113 may be connected to a host 1002, and may send and receive electrical signals such as, for example, data. The interface 1113 may be a device using a standard such as, for example, a Serial Advanced Technology Attachment (SATA) standard, an Integrated Drive Electronics (IDE) standard, a Small Computer System Interface (SCSI) standard, or a combination thereof. The non-volatile memory 1118 may be connected to the interface 1113 via the controller 1115. The non-volatile memory 1118 may function to store data received through the interface 1113. Even when power supplied to the SSD 1100 is interrupted, the data stored in the non-volatile memory 1118 may be retained.

The buffer memory 1119 may include a volatile memory. The volatile memory may be, for example, a DRAM or an SRAM. The buffer memory 1119 may have a relatively faster operating speed than the non-volatile memory 1118.

Data processing speed of the interface 1113 may be relatively faster than the operating speed of the non-volatile memory 1118. Here, the buffer memory 1119 may function to temporarily store data. The data received through the interface 1113 may be temporarily stored in the buffer memory 1119 via the controller 1115, and then permanently stored in the non-volatile memory 1118 according to the data write speed of the non-volatile memory 1118. Further, frequently used items of the data stored in the non-volatile memory 1118 may be pre-read and temporarily stored in the buffer memory 1119. That is, the buffer memory 1119 may function to increase the effective operating speed of the SSD 1100, and may reduce error rate.

The controller 1115, the buffer memory 1119, and the non-volatile memory 1118 may have a configuration as described with reference to FIGS. 1 to 15.

Figure 19:
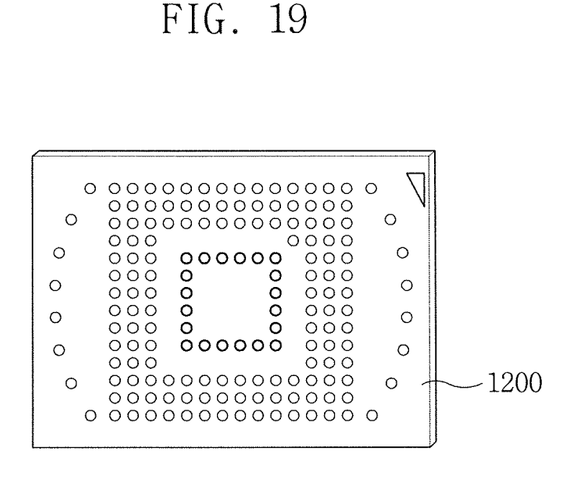
FIGS. 19 to 21 are perspective views showing electronic apparatuses according to exemplary embodiments of the inventive concept.
Figure 20:
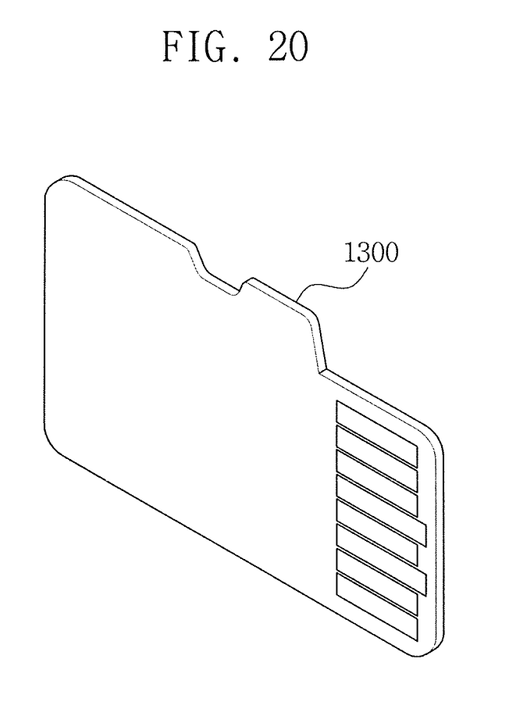
Figure 21:
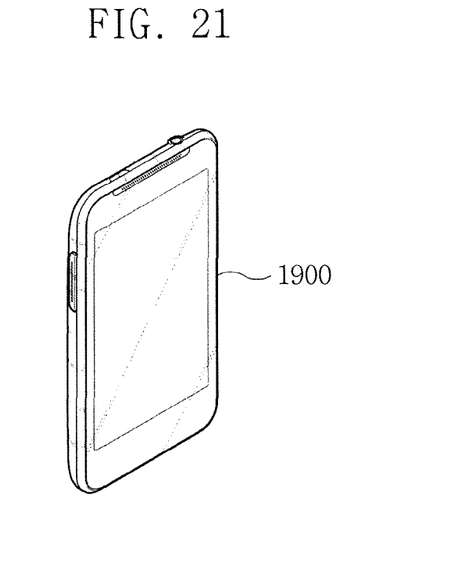
Figure 22:
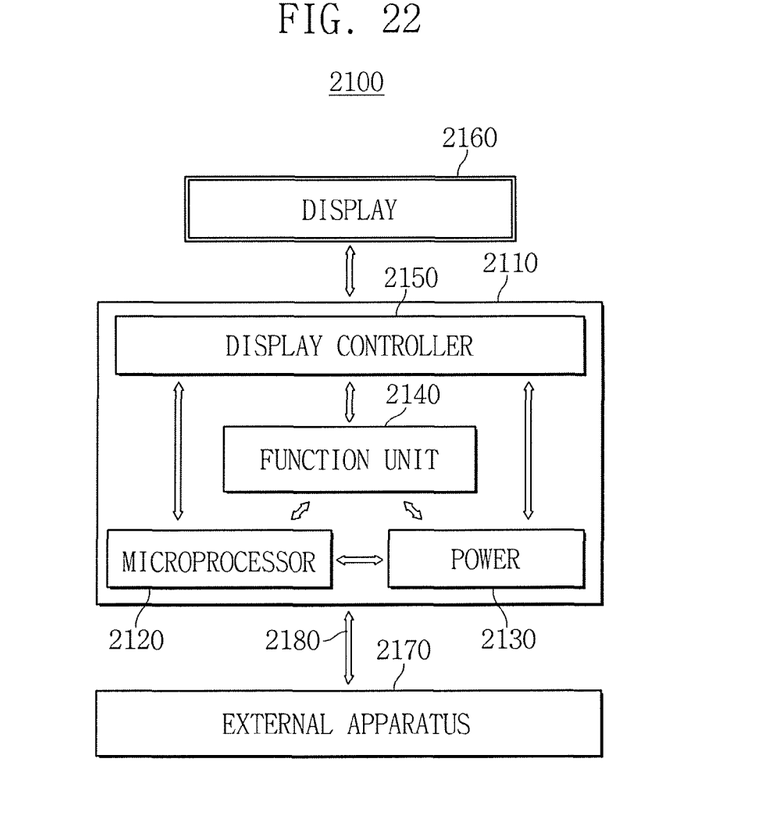
FIG. 22 is a system block diagram of an electronic apparatus according to exemplary embodiments of the inventive concept.

FIGS. 19 to 21 are perspective views showing electronic apparatuses according to exemplary embodiments of the inventive concept. FIG. 22 is a system block diagram of an electronic apparatus according to exemplary embodiments of the inventive concept.

Referring to FIGS. 19 to 21, the semiconductor device described with reference to FIGS. 1 to 15 may be applied to electronic systems such as, for example, an embedded multimedia chip (eMMC) 1200, a micro SD card 1300, a smartphone 1900, a netbook, a laptop computer, a tablet PC, etc. For example, the semiconductor device described with reference to FIGS. 1 to 15 may be installed in a mainboard of the smartphone 1900. The semiconductor device described with reference to FIGS. 1 to 15 may be provided to an expansion apparatus such as, for example, the micro SD card 1300 to be used in combination with the smartphone 1900.

Referring to FIG. 22, the semiconductor device described with reference to FIGS. 1 to 15 may be applied to an electronic system 2100. The electronic system 2100 may include, for example, a body 2110, a microprocessor unit 2120, a power unit 2130, a function unit 2140, and a display controller unit 2150. The body 2110 may be, for example, a motherboard formed of a printed circuit board (PCB). The microprocessor unit 2120, the power unit 2130, the function unit 2140, and the display controller unit 2150 may be installed on the body 2110. A display unit 2160 may be arranged inside or outside of the body 2110. For example, the display unit 2160 may be arranged on a surface of the body 2110 and may display an image processed by the display controller unit 2150.

The power unit 2130 may receive a constant voltage from a power source such as, for example, an external battery or power outlet, divide the voltage into various levels, and supply those voltages to the microprocessor unit 2120, the function unit 2140, and the display controller unit 2150. The microprocessor unit 2120 may receive a voltage from the power unit 2130 to control the function unit 2140 and the display unit 2160. The function unit 2140 may perform various functions of the electronic system 2100. For example, when the electronic system 2100 is a mobile phone, the function unit 2140 may have several components that perform functions of the mobile phone such as output of an image to the display unit 2160 or output of a voice to a speaker, by dialing or communication with an external apparatus 2170. If a camera is installed, the function unit 2140 may function as a camera image processor.

When the electronic system 2100 is connected to a storage device such as, for example, a memory card to expand capacity, the function unit 2140 may be a memory card controller. The function unit 2140 may exchange signals with the external apparatus 2170 through a wired or wireless communication unit 2180. In addition, when the electronic system 2100 includes an interface such as, for example, a universal serial bus (USB) interface to expand functionality, the function unit 2140 may function as an interface controller. The function unit 2140 may include a mass storage apparatus.

The semiconductor device described with reference to FIGS. 1 to 15 may be applied to the function unit 2140 or the microprocessor unit 2120.

According to exemplary embodiments of the inventive concept, a gate electrode covering two adjacent corners of an active region is provided. A first side of the gate electrode has a bent shape. Due to the shape of the gate electrode, a gate length Lg and a gate width Wg can be significantly increased in a limited area. As a result, according to exemplary embodiments of the inventive concept, a semiconductor device capable of achieving high integration and having improved electrical characteristics may be implemented.

While the present inventive concept has been particularly shown and described with reference to the exemplary embodiments thereof, it will be understood by those of ordinary skill in the art that various changes in form and detail may be made therein without departing from the spirit and scope of the present inventive concept as defined by the following claims.

What is claimed is:

1. A semiconductor device, comprising:
   an active region defined on a substrate;
   a gate electrode disposed on the active region and covering two adjacent corners of the active region;
   a drain area formed in the active region adjacent to a first side of the gate electrode; and
   a source area formed in the active region adjacent to a second side of the gate electrode,
   wherein the first and second sides of the gate electrode are spaced apart from each other, and the first side has a bent shape,
   wherein the active region comprises first to fourth sides and first to fourth corners, and the first and second corners are the two adjacent corners, wherein the first side is spaced apart from and disposed opposite the fourth side, the second side is spaced wart from and disposed opposite the third side, the first side is longer than the second side, and the fourth side is longer than the third side, and wherein the first corner is formed between the first side and the second side, the second corner is formed between the first side and the third side, the third corner is formed between the second side and the fourth side, and the fourth corner is formed between the third side and the fourth side.

2. The semiconductor device of claim 1, wherein the first side of the gate electrode crosses over the first side of the active region twice, and wherein the second side of the gate electrode crosses over the second side of the active region and the third side of the active region.

3. The semiconductor device of claim 1, wherein the source area comprises:

a first impurity area formed between the second side of the gate electrode and the second side of the active region; and a second impurity area formed between the second side of the gate electrode and the third side of the active region, wherein the second impurity area is spaced apart from the first impurity area.

4. The semiconductor device of claim 3, further comprising a lightly doped drain (LDD) formed between the first impurity area and the second impurity area.

5. The semiconductor device of claim 3, further comprising:

a first source plug formed on the first impurity area; and a second source plug formed on the second impurity area.

6. The semiconductor device of claim 5, further comprising:

a source line connected to upper ends of the first source plug and the second source plug, wherein the first source plug and the second source plug form an equipotential structure.

7. The semiconductor device of claim 1, wherein the first side of the gate electrode has a V-shape, a C-shape, a bathtub-shape, or a bumpy shape having two or more inflection points.

8. The semiconductor device of claim 1, wherein the second side of the gate electrode has a bathtub-shape, a line-shape, a V-shape, a C-shape, or bumpy shape having two or more inflection points.

9. The semiconductor device of claim 1, wherein the drain area has a triangular shape, a half-moon shape, or a trapezoidal shape.

10. The semiconductor device of claim 1, wherein a side of the drain area has a bumpy shape that is aligned with the first side of the gate electrode and has two or more inflection points.

11. A semiconductor device, comprising:

an active region defined on a substrate;

a first gate electrode disposed on the active region and covering two adjacent corners of the active region;

a second gate electrode disposed on the active region, wherein the second gate electrode is symmetrical with the first gate electrode and is spaced apart from the first gate electrode;

a first drain area formed in the active region adjacent to a first side of the first gate electrode;

a second drain area formed in the active region adjacent to a first side of the second gate electrode; and a source area formed in the active region between a second side of the first gate electrode and a second side of the second electrode, wherein the first side of the first gate electrode has a bent shape, wherein the active region comprises first to fourth sides and first to fourth corners, and the first and second corners are the two adjacent corners, wherein the second gate electrode covers the third corner and the fourth corner, wherein the first side is spaced apart from and disposed opposite the fourth side, the second side is spaced apart from and disposed opposite the third side, the first side is longer than the second side, and the fourth side is longer than the third side, and wherein the first corner is formed between the first side and the second side, the second corner is formed between the first side and the third side, the third corner is formed between the second side and the fourth side, and the fourth corner is formed between the third side and the fourth side.

12. The semiconductor device of claim 11, wherein the source area comprises:

a first impurity area formed between the first gate electrode, the second gate electrode, and the second side of the active region; and a second impurity area formed between the first gate electrode, the second gate electrode, and the third side of the active region, wherein the second impurity area is spaced apart from the first impurity area.

13. The semiconductor device of claim 11, further comprising:

a first source plug formed on the first impurity area;

a second source plug formed on the second impurity area; and a source line connected to upper ends of the first source plug and the second source plug, wherein the first source plug and the second source plug form an equipotential structure.

14. A semiconductor device, comprising:

a memory array comprising a plurality of memory cells; and a plurality of sense amplifiers connected to the memory cells, wherein each of the plurality of sense amplifiers comprises a plurality of transistors, wherein each of the plurality of transistors comprises:

an active region defined on a substrate;

a first gate electrode disposed on the active region and covering two adjacent corners of the active region;

a second gate electrode disposed on the active region, wherein the second gate electrode is symmetrical with the first gate electrode and is spaced apart from the first gate electrode;

a first drain area formed in the active region adjacent to a first side of the first gate electrode;

a second drain area formed in the active region adjacent to a first side of the second gate electrode; and a source area formed in the active region between a second side of the first gate electrode and a second side of the second electrode, wherein the first side of the first gate electrode has a bent shape, wherein the active region comprises first to fourth sides and first to fourth corners, and the first and second corners are the two adjacent corners, wherein the second gate electrode covers the third corner and the fourth corner, wherein the first side is spaced apart from and disposed opposite the fourth side, the second side is spaced apart from and disposed opposite the third side, the first side is longer than the second side, and the fourth side is longer than the third side, and wherein the first corner is formed between the first side and the second side, the second corner is formed between the first side and the third side, the third corner is formed between the second side and the fourth side, and the fourth corner is formed between the third side and the fourth side.

15. The semiconductor device of claim 14, wherein the first side of the first gate electrode and the first side of the second gate electrode have a V-shape, a C-shape, a bathtub-shape, or a bumpy shape having two or more inflection points.

16. The semiconductor device of claim 14, wherein the source area comprises:

a first impurity area formed between the first gate electrode, the second gate electrode, and the second side of the active region; and a second impurity area formed between the first gate electrode, the second gate electrode, and the third side of the active region, wherein the second impurity area is spaced apart from the first impurity area.

17. The semiconductor device of claim 16, further comprising:

a first source plug formed on the first impurity area;

a second source plug formed on the second impurity area; and a source line connected to upper ends of the first source plug and the second source plug, wherein the first source plug and the second source plug form an equipotential structure.

* * * * *